(12) United States Patent
Draxelmayr et al.

(10) Patent No.: US 8,872,589 B2
(45) Date of Patent: Oct. 28, 2014

(54) SYSTEM AND METHOD FOR A PROGRAMMABLE GAIN AMPLIFIER

(71) Applicant: Infineon Technologies AG, Neubiberg (DE)

(72) Inventors: Dieter Draxelmayr, Villach (AT); Michael Kropfitsch, Koettmannsdorf (AT); Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 13/623,583

(22) Filed: Sep. 20, 2012

(65) Prior Publication Data

US 2014/0077882 A1    Mar. 20, 2014

(51) Int. Cl.
*H03G 3/12* (2006.01)

(52) U.S. Cl.
USPC .......................................... 330/282; 330/260

(58) Field of Classification Search
USPC ........................................ 330/282, 9, 51, 260
See application file for complete search history.

(56) References Cited

U.S. PATENT DOCUMENTS

| | | | |
|---|---|---|---|
| 5,363,055 A * | 11/1994 | Ribner | 330/9 |
| 5,399,989 A | 3/1995 | Chern | |
| 6,556,072 B1 * | 4/2003 | Nicollini et al. | 327/554 |
| 7,199,654 B1 * | 4/2007 | Luo et al. | 330/9 |
| 7,920,022 B2 * | 4/2011 | Josefsson | 330/9 |
| 8,004,350 B2 | 8/2011 | Draxelmayr | |
| 8,067,958 B2 | 11/2011 | Draxelmayr | |
| 8,374,363 B2 * | 2/2013 | Onishi | 381/122 |
| 2003/0155966 A1 | 8/2003 | Harrison | |
| 2011/0142261 A1 | 6/2011 | Josefsson | |

FOREIGN PATENT DOCUMENTS

WO    WO-2009/135815 A1    11/2009

OTHER PUBLICATIONS

Harrison, R. R., et al., "A Low-Power Low Noise CMOS Amplifier for Neural Recording Applications," IEEE Journal of Solid-State Circuits, Jun. 2003, pp. 958-965, vol. 38, No. 6.
Delbruek, T., et al., "Analog VLSI Adaptive, Logarithmic, Wide-Dynamic-Range Photoreceptor," 4 pages; 1994.
Vittoz, E., et al., "CMOS Analog Integrated Circuits Based on Weak Inversion Operation," IEEE Journal of Solid-State Circuits, vol. Sc-12, No. 3, Jun. 1977, pp. 224-231.
Harrison, R.R., "Integrated Circuits for Neural Interfacing," Circuits for Emerging Technologies, Feb. 15, 2008, pp. 1-12.
Feng, P., et al., "History of the High-Voltage Charge Pump," Book Excerpt, Nov. 2006, pp. 1-9, Chapter 1, Professional Engineering 6X9, Charge Pump Circuit Design.

* cited by examiner

*Primary Examiner* — Henry Choe
(74) *Attorney, Agent, or Firm* — Slater & Matsil, L.L.P.

(57) ABSTRACT

In accordance with an embodiment, a system includes a programmable gain amplifier having a switchable feedback capacitor coupled in parallel with a first capacitor and a controller. The controller is configured to couple the feedback capacitor between an input node of the programmable gain amplifier and an output node of the programmable gain amplifier in a first gain setting, and switch a first terminal of the feedback capacitor from the output of the programmable gain amplifier to a reference node while a second terminal of the feedback capacitor remains coupled to the input node of the programmable gain amplifier for a first time period when transitioning from the first gain setting to a second gain setting.

30 Claims, 9 Drawing Sheets

SYSTEM AND METHOD FOR A PROGRAMMABLE GAIN AMPLIFIER

TECHNICAL FIELD

This invention relates generally to semiconductor circuits and methods, and more particularly to a system and method for a programmable gain amplifier.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm, is etched directly onto an integrated circuit.

Environmental sound pressure levels span a very large dynamic range. For example, the threshold of human hearing is at about 0 dBSPL, conversational speech is at about 60 dBSPL, while the sound of a jet aircraft 50 m away is about 140 dBSPL. While the diaphragm of a microphone, such as a MEMS microphone, may be able to withstand high intensity acoustic signals and faithfully convert these high intensity acoustic signals into an electronic signal, dealing with such high-level signals poses some difficulties. For example, many amplifiers and preamplifiers for acoustic microphones are optimized for a particular dynamic range. As such, these systems may not be able to handle the full audio range without adding significant distortion. The interfacing of a MEMS microphone or sensor with an electrical system, however, poses a number of difficulties because of the microphone's very high output impedance. For example, loading by the preamplifier may potentially attenuate the microphone's output signal, and the high resistance nature of the MEMS microphone makes it prone to EMI disturbance and power supply disturbances due to a poor power supply rejection ratio (PSRR). As such, amplifiers that interface to capacitive signal sources, such as MEMS microphones have a high impedance input stage that are often implemented using amplifiers with capacitive feedback. When such amplifiers are configured to have programmable gain, for example, by switching in and out different values of feedback capacitors, perturbations in the operating points of the amplifiers and its associated capacitors may cause distortion in the signal.

SUMMARY OF THE INVENTION

In accordance with an embodiment, a system includes a programmable gain amplifier having a switchable feedback capacitor coupled in parallel with a first capacitor and a controller. The controller is configured to couple the feedback capacitor between an input node of the programmable gain amplifier and an output node of the programmable gain amplifier in a first gain setting, and switch a first terminal of the feedback capacitor from the output of the programmable gain amplifier to a reference node while a second terminal of the feedback capacitor remains coupled to the input node of the programmable gain amplifier for a first time period when transitioning from the first gain setting to a second gain setting.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a programmable gain amplifier. Embodiments of the present invention are not limited to programmable gain amplifiers, and may also be applied to other circuit structures, such as switched capacitor circuits, variable gain amplifiers, sensor circuits, audio amplifiers, as well as other types of circuits.

In an embodiment of the present invention, the gain of a programmable gain amplifier is changed by switching a terminal of a switchable feedback capacitor from an output of an amplifier to a reference node while the second terminal of the switchable feedback capacitor remains coupled to the input of the amplifier, thereby transferring charge from the switchable feedback capacitor to remaining capacitors coupled between the input of the amplifier and the output of the amplifier. In some embodiments, this charge transfer reduces DC errors in the output signal when a gain setting is changed.

In an embodiment, the high dynamic range of the microphone may be utilized by compensating gain changes at the programmable gain amplifier at the front end of the system by changing in gain in a later stage of the system. For example, a large gain in the front end of the system may be applied to small amplitude microphone signals that are later compensated with low gain or attenuation; or a small gain or attenuation in the front end may be applied to large amplitude microphone signals that are later compensated with a larger gain in a later stage. The net effect of the signal path is an apparent constant gain. In some embodiments, discontinuities at gain setting boundaries may be compensated by applying a corresponding gain adjustment at a later state of signal processing.

Figure 1A:
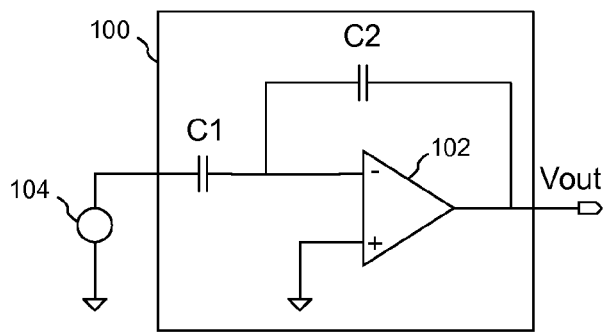
FIGS. 1a-c illustrate conventional capacitive amplifiers and a corresponding waveform diagram.

FIG. 1a illustrates conventional amplification system 100 that may be used to amplify the output of voltage source 104. System 100 includes amplifier 102, input capacitor C1, and feedback capacitor C2. The voltage transfer function at low frequencies may be expressed as:

$$A = \frac{Vout}{Vin} = \frac{C1}{C2}.$$

In the above equation, it is assumed that the capacitance of the signal source is much greater than the capacitance of input capacitor C1.

Figure 1B:
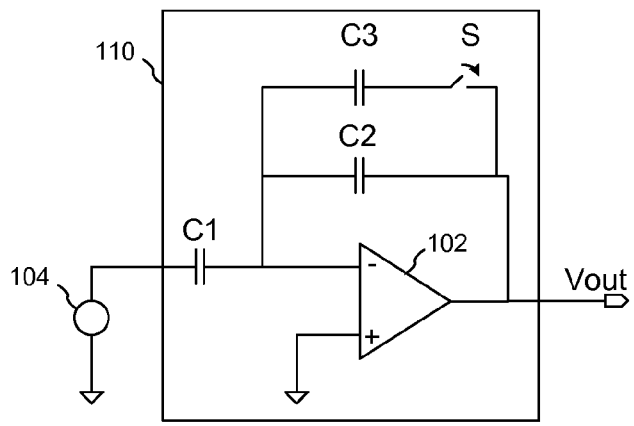

The gain of the capacitive amplifier may be adjusted by adjusting the capacitance of either C1 or C2. FIG. 1b illustrates a conventional programmable gain capacitive amplifier 110 in which capacitor C3 may be connected and disconnected from amplifier 110 via switch S. For example, when switch S is open, the voltage gain of amplifier 110 is about $$\frac{C1}{C2}.$$

When switch S is closed, the voltage gain of amplifier 110 is about $$\frac{C1}{C2+C3}.$$

Figure 1C:
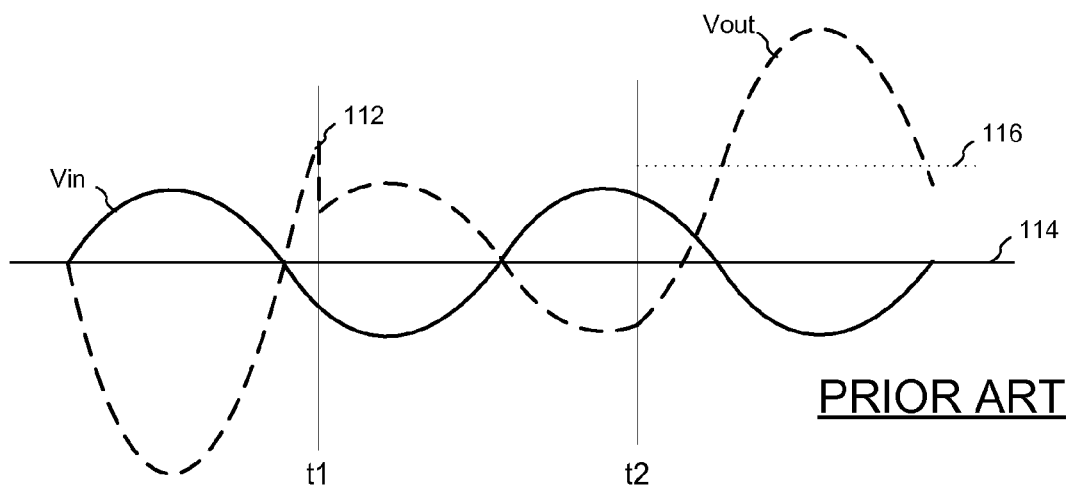

FIG. 1c illustrates a waveform diagram showing voltages Vout and Vin while capacitor C3 is switched into amplifier 110 when switch S is closed at time t1, and switched out of amplifier 110 when switched S is opened at time t2. When capacitor C3 is switched out of the circuit at time t1, immediate charge sharing causes discontinuity 112 in the Vout waveform, along with a corresponding decrease in gain. When switch S is opened at time t2, the gain of amplifier 110 increases. Even though output voltage Vout remains continuous at time t2, the DC voltage level Vout shifts from voltage 114 to voltage 116.

Figure 2A:
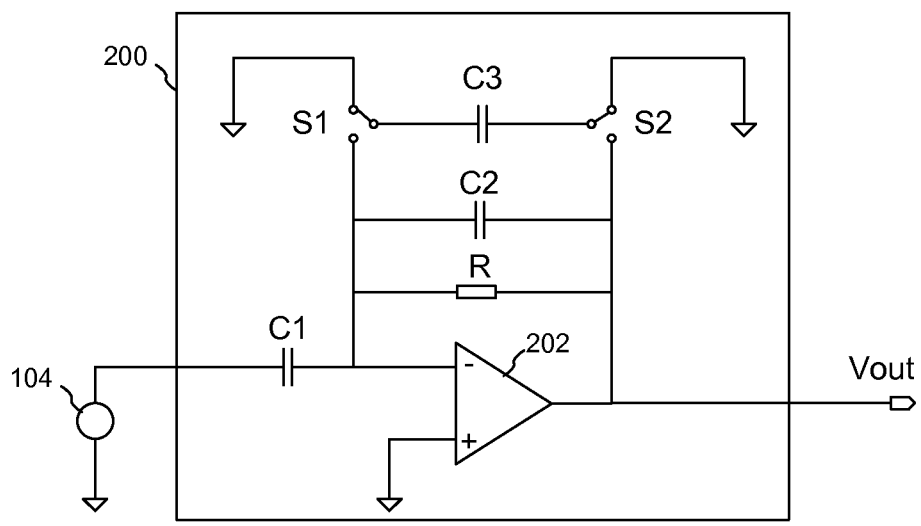
FIGS. 2a-2f illustrate an embodiment programmable gain amplifier and a corresponding waveform diagram.

FIG. 2a illustrates a programmable gain amplifier 200 according to an embodiment of the present invention. Programmable gain amplifier 200 includes amplifier 202 having resistor R and capacitor C2 in feedback. Resistor R may be high value resistor used to bias inverting input of amplifier 202. The value of resistor R may be set to a high value, for example, in the GΩ region. In some embodiments, resistor R may be implemented using high resistance networks such as the circuit illustrated in FIG. 7 and described below.

Capacitor C1 couples voltage Vin to the inverting input of amplifier 202. Signal source 104 represents an input signal source that may include a capacitive signal source such as a MEMS microphone or a capacitive sensor. It should be understood however, that in some embodiments, capacitor C1 may be implemented, in whole or in part, by the capacitance of the capacitive signal source. Switches S1 and S2 selectively couple terminals of C3 to ground or to corresponding terminals of capacitor C2. While capacitor C3 is initially shown to be coupled to ground, in alternative embodiments of the present invention, other reference voltages besides ground may be coupled to the upper terminals of switches S1 and S2 and to the non-inverting input of amplifier 202.

FIGS. 2a-d illustrate an embodiment switching sequence that may be used to switch capacitor C3 in and out of amplifier 200. FIG. 2a illustrates an initial state in which S1 and S2 are in the upper position and couple each terminal of capacitors C3 to ground. During this initial state, the gain of amplifier 200 is about $$\frac{C1}{C2}.$$

Figure 2B:
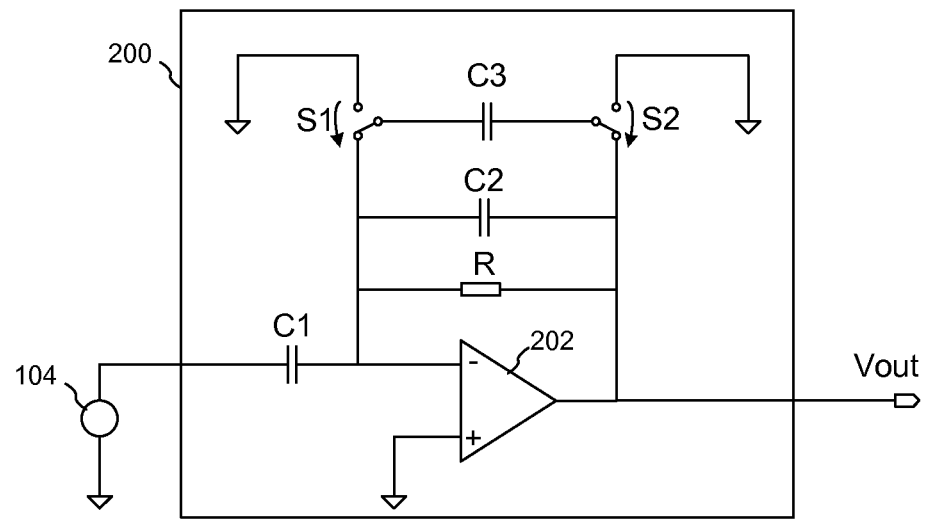

Next, according to FIG. 2b, switches S1 and S2 couple both ends of capacitor C3 to the terminals of capacitor C2. In some embodiments, S1 may lead S2 in the switching. Alternatively, S1 and S2 may be switched simultaneously. During this state, the gain of amplifier 200 is about $$\frac{C1}{C2+C3}.$$

The voltage gain of amplifier 200 may then be once again increased from $$\frac{C1}{C2+C3}$$

to $$\frac{C1}{C2}$$

by coupling the right side of capacitor C3 to ground via switch S2 while the left side of capacitor C2 remains coupled to the input of amplifier 202. Here, charge 220 in capacitor C3 is redistributed to capacitor C2 because the feedback action of amplifier 202 causes the non-inverting input of amplifier 202 to assume a voltage very close to ground potential. As such, capacitor C3 is effectively discharged. In some embodiments, operation of amplifier 200 may proceed with switch S1 coupled in the lower position and switch S2 coupled in the upper position as shown in FIG. 2c.

Figure 2C:
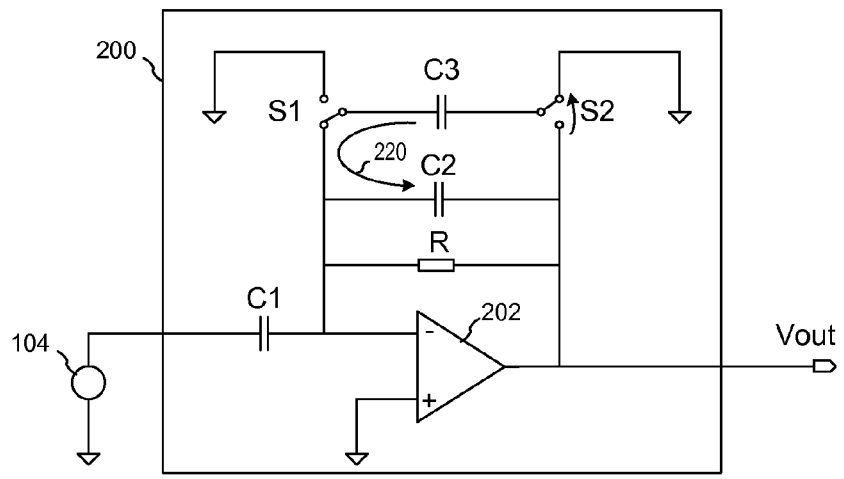
Figure 2D:
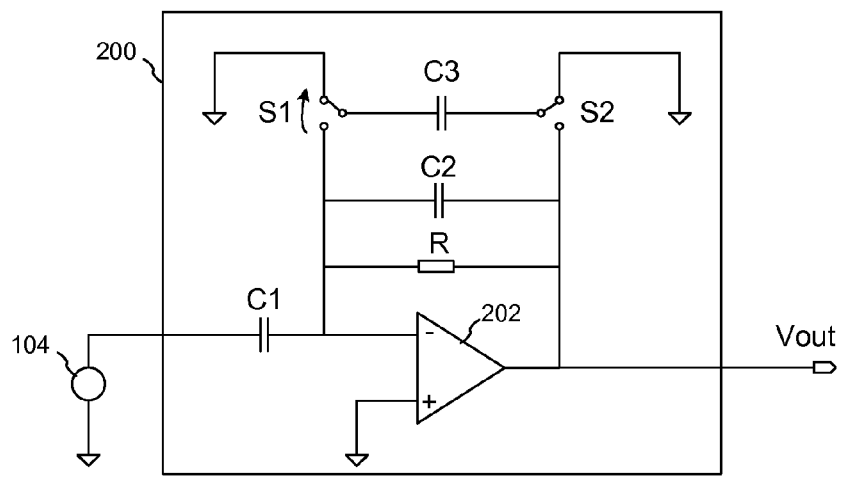

Next, switch S1 further couples the left side of capacitor C3 to ground as shown in FIG. 2d. In an embodiment, S1 is switched a period of time after S2 is switched in order to allow enough time for amplifier 202 to settle in the redistribution step. In alternative embodiments, the left side of C3 may remain coupled to the non-inverting input of amplifier 202.

While the gain of programmable amplifier is about the same in the configurations shown in FIGS. 2c and 2d, the configuration of FIG. 2c presents a high capacitive load to the input of amplifier 202 and may increase the noise sensitivity of the system.

Figure 2E:
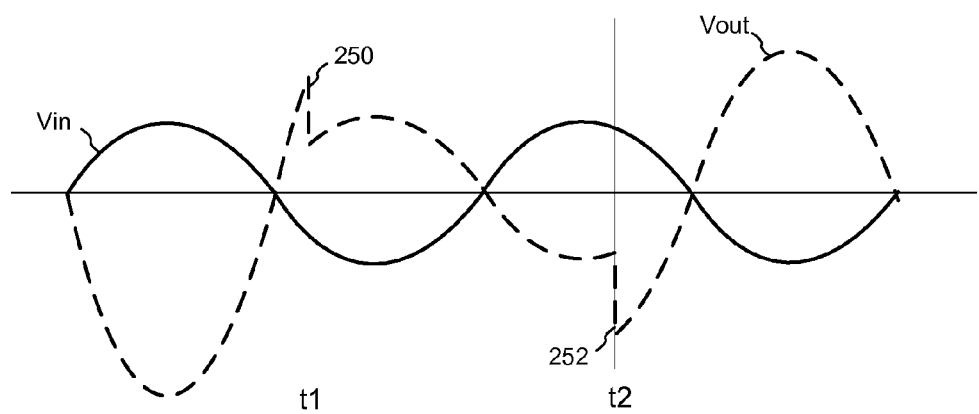

FIG. 2e illustrates a waveform diagram of voltages Vin and Vout for embodiment amplifier 200 according to the switching sequence illustrated in FIGS. 2a-d. Initially, capacitor C3 is not coupled in parallel with capacitor C2 and the gain of the amplifier at time t1 is $$\frac{C1}{C2}.$$

At time t1, capacitor C3 is coupled in parallel with capacitor C2 and the gain decreases to about $$\frac{C1}{C2+C3}.$$

At time t2, the right side of capacitor C2 is disconnected from the output terminal of amplifier 202 and coupled to ground, thereby causing the gain of amplifier 200 to once again decrease to $$\frac{C1}{C2}.$$

It can be seen that Vout has voltage jump 250 at time t1 and voltage jump 252 at time t2.

The magnitude of the change in voltage of Vout at times t1 and t2 may be expressed as follows:

$$\Delta V = Vin\left(\frac{C1}{C2} - \frac{C1}{C2+C3}\right)$$
$$= Vin\left(\frac{C1(C2+C3)}{C2(C2+C3)} - \frac{C1C2}{C2(C2+C3)}\right)$$
$$= Vin\frac{C1C3}{C2(C2+C3)}.$$

Accordingly, the magnitude of charge $\Delta Q$ transferred may be expressed as:

$$\Delta Q = Vin\frac{C1C3}{(C2+C3)}.$$

If it is assumed that all of this charge comes from capacitor C3, then the change in voltage across capacitor C3 may be expressed as:

$$\frac{\Delta Q}{C3} = Vin\frac{C1}{(C2+C3)}.$$

Since the magnitude of the voltage jump 250 at time t1 and voltage jump 252 at time t2 are predictable, as described above, the effect of these voltage jumps may be compensated in later stages by applying, for example, a corresponding gain correction at output signal Vout at times corresponding to t1 and t2. For example, if the change in gain is applied by the embodiment programmable gain amplifier is +6 dB at the front end, a corresponding gain change of −6 dB may be applied at a later stage.

Figure 2F:
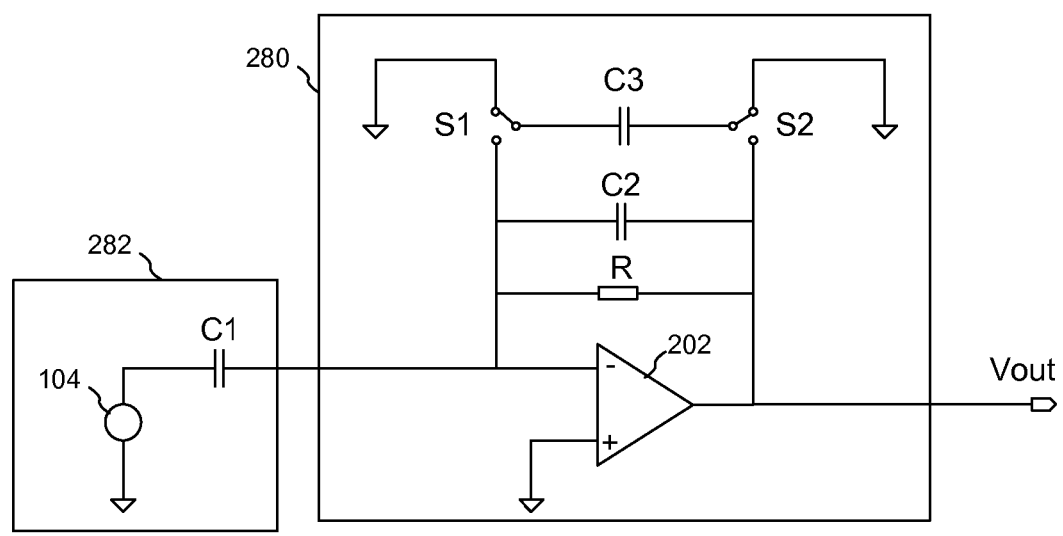

FIG. 2f illustrates embodiment amplifier 280 in which capacitor C1 and voltage source 104 is included within capacitive signal source 282, which may be a source such as a MEMS microphone or sensor. In such embodiments, voltage source 104 represents the signal generated by the capacitive signal source and capacitor C1 represents the capacitance of the capacitive signal source. It should be understood that voltage source 104 and capacitor C1 represented in other embodiments described herein may implemented by capacitive signal source 282. In such embodiments, the output of signal source 282 may be coupled to amplifier 202 with or without an additional intervening series capacitor.

Figure 3A:
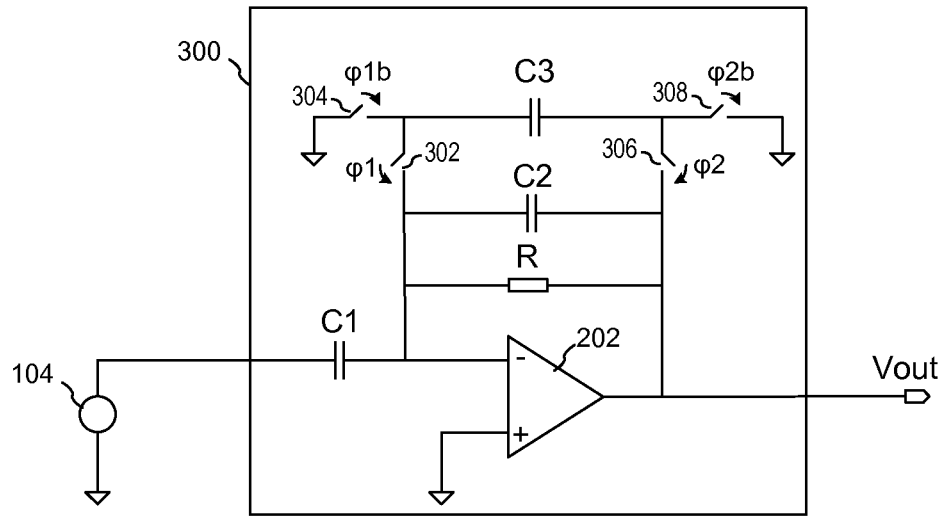
FIGS. 3a-c illustrate an further embodiment programmable gain amplifier and a corresponding timing diagram.

FIG. 3a illustrates embodiment amplifier 300 in which switch S1 is implemented with switches 302 and 304 that are controlled by signals φ1 and φ1b, and switch S2 is implemented using switches 306 and 308 that are controlled by signals φ2 and φ2b.

Figure 3B:
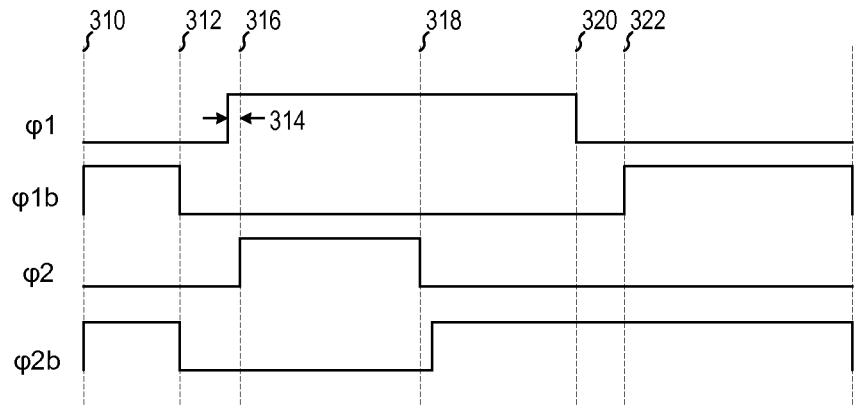

FIG. 3b illustrates a waveform diagram that illustrates the operation of switches 302, 304, 306 and 308 via signals φ1, φ1b, φ2 and φ2b. In the waveform diagram, a high signal level represents a level that activates the corresponding switch, and a low level represents a level that deactivates the corresponding switch. It should be understood that the actual voltage levels that activate and deactivate the switches may be determined by the particular switch and its specifications. For example, in some embodiments, switches 302, 304, 306 and 308 may use an active low signal instead of an active high signal. At time 310, signals φ1b and φ2b are activated such that both ends of capacitor C3 are coupled to ground such that the gain of amplifier 300 is about $$\frac{C1}{C2}.$$

Next, at time 312, signals φ1b and φ2b are brought low before signals φ1 and φ2 are activated during time 316 to avoid discharging capacitor C2 to ground. Between time 316 and time 318, capacitor C3 is coupled in parallel with capacitor C2 such that the gain of the amplifier is about $$\frac{C1}{C2+C3}.$$

In some embodiments, signal φ1 is activated at time interval 314 before signal φ2 in order to avoid charge loss due to transient signals forward biasing parasitic diodes.

At time 318, signal φ2 is brought low and φ2b is activated a short time thereafter to allow capacitor C3 to discharge to capacitor C2, thereby increasing the gain back to about $$\frac{C1}{C2}.$$

Finally, at time 320, φ1 is also brought low and φ1b is activated shortly thereafter. The cycle repeats itself at time 322, when signal φ1b is activated.

Figure 3C:
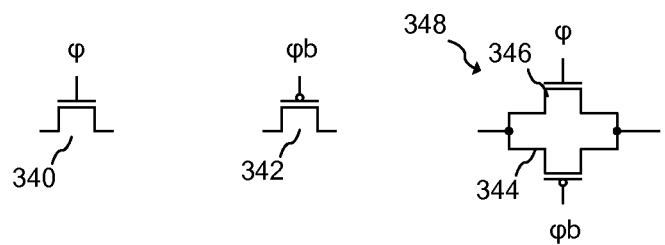

FIG. 3c illustrates various switch embodiments that may be used to implement switches 302, 304, 306 and 308. For example, a switch may be implemented using NMOS transistors 340, PMOS transistor 342, or CMOS transmission gate 348 that is a parallel combination of NMOS transistor 346 and PMOS transistor 344. It should be understood that the switch implementations illustrated in FIG. 3c are just a few examples of embodiment switch implementations, as other switch circuits known in the art may be used. It should be understood that switching circuits and methods described and shown in FIGS. 3a-c may be applied to the switches of other embodiments described an illustrated herein.

Figure 4:
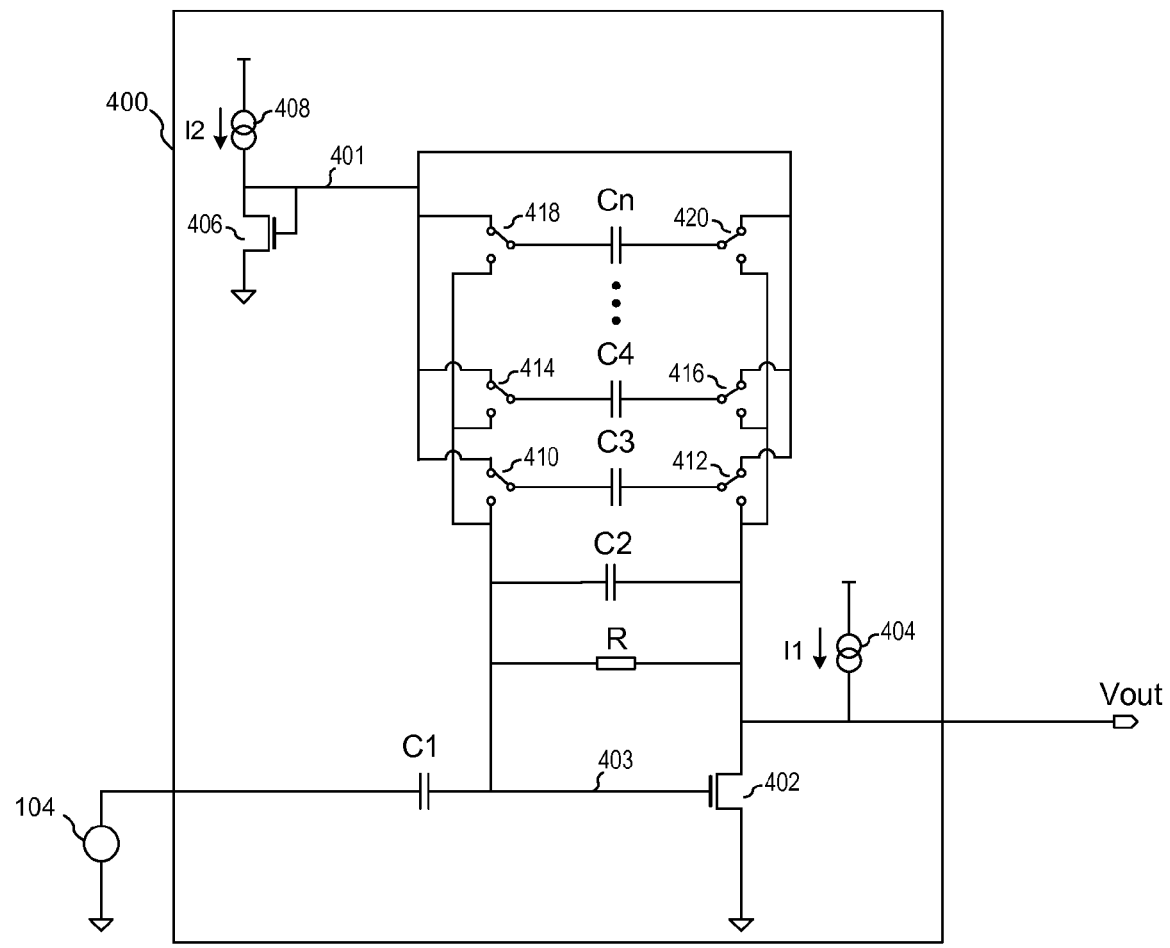
FIG. 4 illustrates an embodiment programmable gain amplifier having a plurality of switchable feedback capacitors.

FIG. 4 illustrates amplifier 400 according to another embodiment of the present invention. Amplifier 400 has a plurality of switchable capacitors represented by capacitor C3 and switches 410 and 412, C4 and switches 414 and 416, and Cn and switches 418 and 420. It should be understood, however, that any number of capacitors may be switched in parallel with capacitor C2 such that amplifier 400 may be configured to have multiple different gain settings. Accordingly, amplifier 400 may be configured to have a maximum voltage gain of about $$\frac{C1}{C2}$$

and a minimum voltage gain of about $$\frac{C1}{C2 + C3 + C4 + \ldots + Cn}.$$

By adjusting and scaling the values of capacitors C1 to Cn, a variety of different gain settings may be implemented. Capacitors C3 to Cn may be switched in and out of the amplifier as described in embodiments above. For example, in one embodiment, n=14, such that 13 different feedback capacitors are used having the following values: C2=400 fF, C3=200 fF, C4=200 fF, C5=400 fF, C6=400 fF, C7=800 fF, C8=800 fF, C9=1.6 pF, C10=1.6 fF, C11=3.2 pF, and C12=3.2 pF, C13=6.4 pF, and C14=6.4 pF. Input capacitor C1 may have a value of about 2 pF and may be implemented, for example, using the capacitance of the capacitive sensor or microphone itself, or using a combination of the capacitive sensor capacitance and a fixed capacitance. In some embodiments, capacitors C3 to Cn may be binary weighted. Alternatively, a value weighting of less than binary, for example, a factor of 1.5, may be used to provide smaller step sizes. It should be understood that in alternative embodiments, a different number of feedback capacitors and/or capacitors having different values from the above example may be used. Moreover, multiple switchable feedback capacitors may be applied to other embodiments described herein that only illustrate a signal switchable feedback capacitor.

In an embodiment, the forward gain of amplifier 400 is provided by NMOS transistor 402 that is biased by current source 404, and reference node 401 is biased by diode connected NMOS transistor 406 and current source 408. Transistors 402 and 406 and the currents I1 and I2 delivered by current sources 404 and 408 may be scaled such that the quotients of the current and aspect ratio for each transistor is about equal in order to provide substantially equal bias voltages at nodes 401 and 403. Alternatively, other transistor types may be used for transistors 402 and 406, and or different biasing schemes known in the art may be implemented.

Figure 5A:
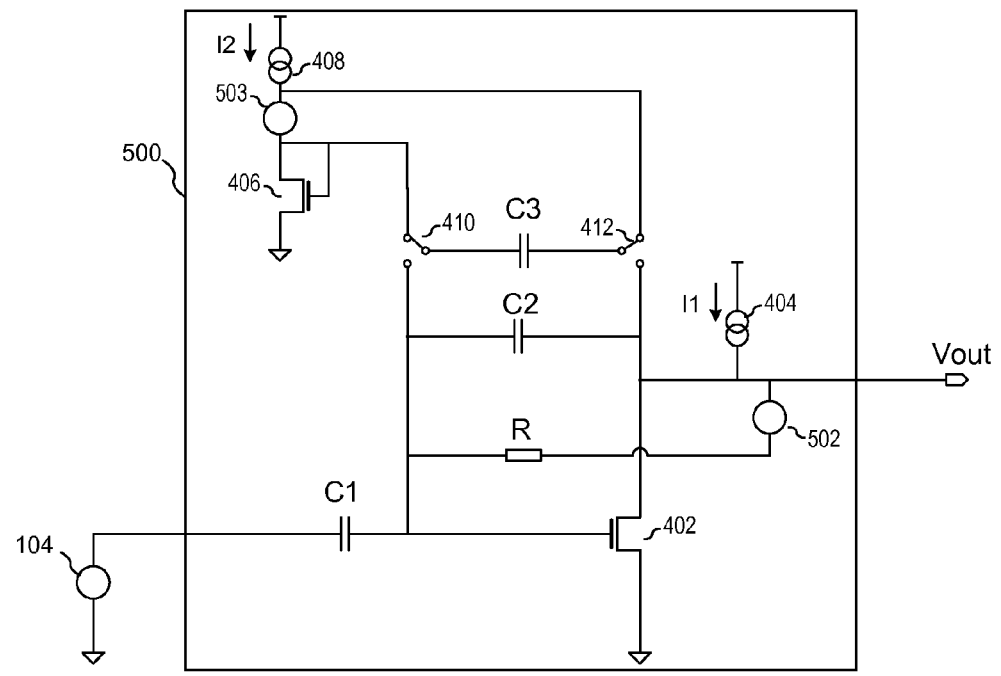
FIGS. 5a-b illustrate embodiment programmable gain amplifiers having a level shifted output.
Figure 5B:
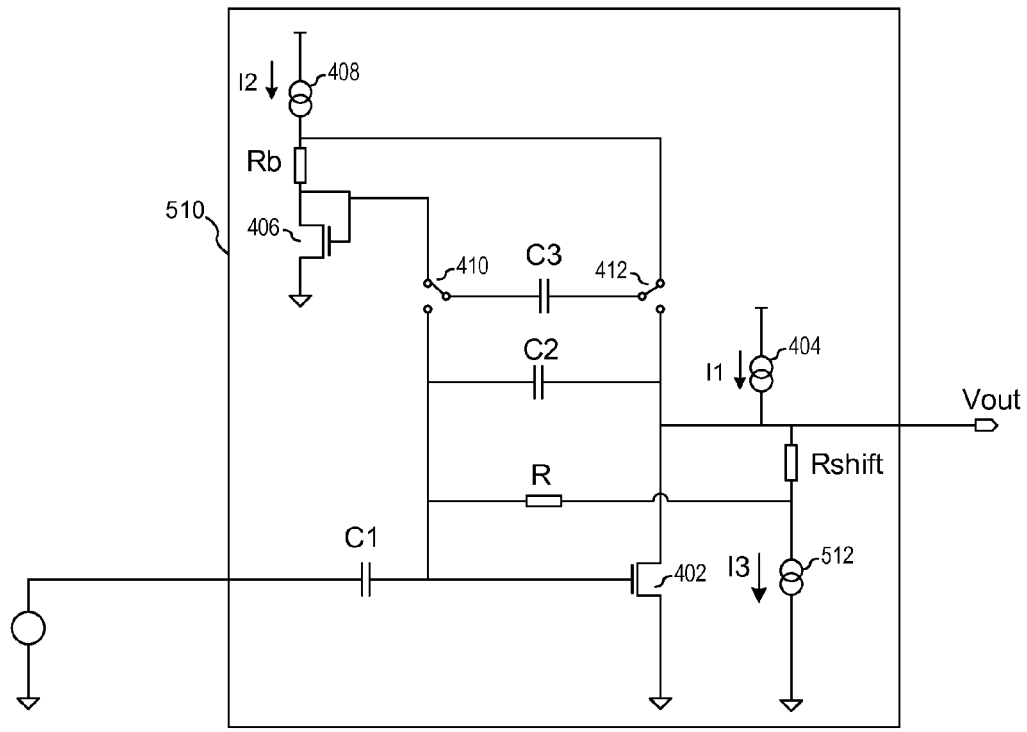

FIG. 5a illustrates embodiment amplifier 500 in which voltage source 502 shifts the DC level of output voltage Vout to allow for more headroom at the drain of transistor 402. Accordingly, amplifier 500 can output a higher amplitude before transistor 402 is driven into the linear region of operation. One terminal of switch 412 is coupled to transistor 406 via voltage source 503 that has a voltage drop the same as or similar to voltage source 502. FIG. 5b illustrates embodiment amplifier 510 in which voltage source 502 is implemented using resistor Rshift in series with current source 512 to provide a level shift of about I3*Rshift. Accordingly, switch 412 is coupled to transistor 406 via resistor Rb, such that I3*Rshift is about the same as I2*Rb. It should be understood that the embodiment level shifters shown in FIGS. 5a-b may be applied to other embodiments described herein.

Figure 6:
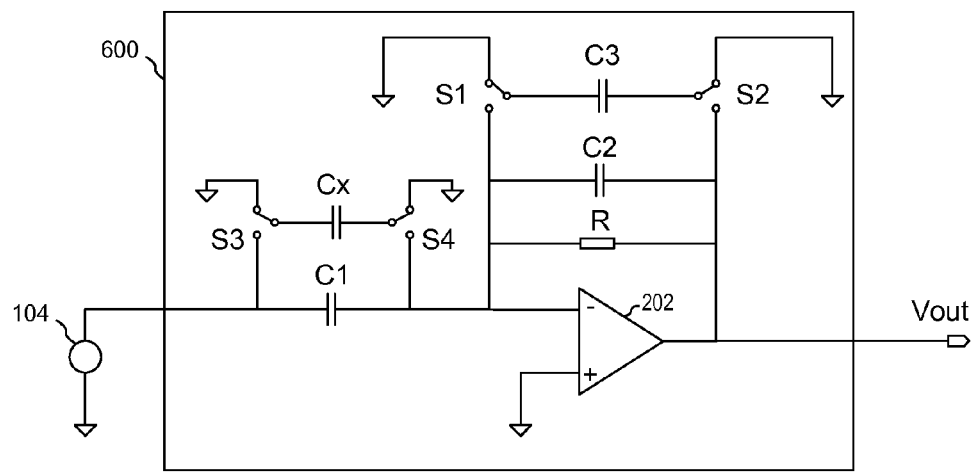
FIG. 6 illustrates an embodiment programmable gain amplifier having an adjustable input capacitor.

FIG. 6 illustrates embodiment amplifier 600 having an adjustable input capacitance as well as an adjustable feedback capacitors. In an embodiment, capacitor Cx may be switched in parallel with C1 using switches S3 and S4. Accordingly, the gain of amplifier 600 may be varied between about $$\frac{C1 + Cx}{C2}$$

and about $$\frac{C1}{C2 + C3}.$$

In an embodiment, capacitor Cx may be switched in an out of the circuit in a similar manner as capacitor C3. For example, when capacitor Cx is coupled in parallel with C1, switches S3 and S4 may be activated in the lower position. When capacitor Cx is disconnected from capacitor C1, switch C3 may toggle to the upper position while switch S4 remains in the lower position for enough time for the system to settle, after which switch S4 is toggled to the upper position. Alternatively, switch S4 may remain in the lower position. It should be understood that the embodiment adjustable input capacitance may be applied to other embodiments described herein.

Figure 7:
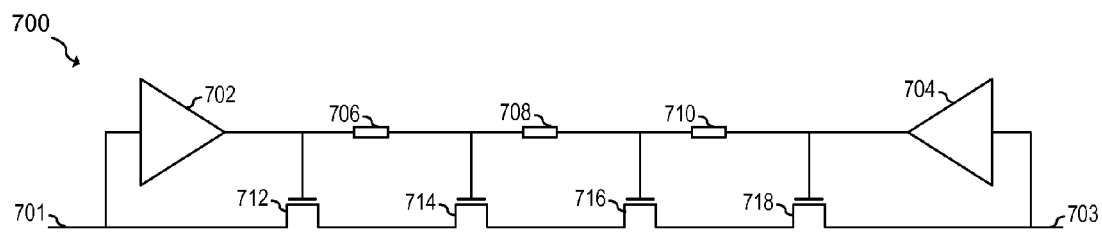
FIG. 7 illustrates an active implementation of an embodiment feedback resistor.

In some embodiments, the feedback resistance of embodiment amplifiers described in embodiments herein may be implemented using active circuitry 700 illustrated in FIG. 7. Resistors 706, 708 and 710 forming a resistor ladder are coupled between the outputs of buffers 702 and 704 having inputs at resistor terminals 701 and 703, respectively. Transistors 712, 714, 716 and 718 have gates coupled to the resistor ladder formed by resistors 706, 708 and 710. Buffers 702 and 704 may be level shifting buffers such that the gates of transistors 712, 714, 716 and 718 are biased to provide a finite resistance. In some embodiments, active circuitry 700 may implement a resistance of in the order of about 500 GΩ to about 1 TΩ. Resistances outside of this range may also be implemented using active circuitry 700. Active circuitry 700, as well as other active resistance circuitry that may be applied to embodiments herein, is described in co-pending U.S. patent application Ser. No. 13/676,542 filed on Nov. 14, 2012 entitled "Linearized High-Ohmic Resistor." In further embodiments, feedback resistors may be further implemented using circuits and systems described in U.S. Pat. No. 8,004,350 filed on Jun. 3, 2009, entitled "Impedance transformation with transistor circuits;" and U.S. Pat. No. 8,067,958 filed on Jan. 12, 2010, entitled "Mitigating side effects of impedance transformation circuits," both of which applications are incorporated herein by reference in their entirety.

Figure 8:
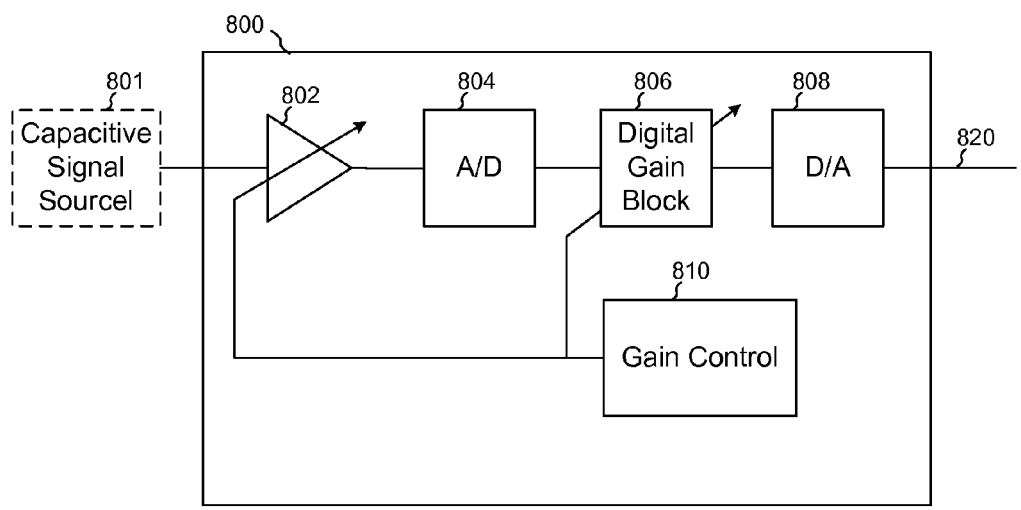
FIG. 8 illustrates an integrated circuit that incorporates an embodiment programmable gain amplifier.

FIG. 8 illustrates embodiment capacitive signal source signal processing integrated circuit (IC) 800 that is configured to be coupled with capacitive signal source 801, which is shown in dashed lines to indicate that it is not necessarily a part of IC 800. In some embodiments, however, capacitive signal source 801 may also be included on IC 800. Capacitive signal source 801 may be a MEMS microphone, a capacitive sensor, or other signal source having a capacitive impedance. Alternatively, signal source 801 may be a signal source having a non-capacitive impedance.

IC 800 has front-end programmable amplifier 802 followed by analog-to-digital converter 804, digital gain block 806 and digital to analog converter 808. The output of digital to analog converter 808 may be coupled to analog output signal pin 820. A programmable gain amplifier 802 may be implemented using embodiment amplifiers described herein. Analog-to-digital converter 804 may be implemented using analog-to-digital converter circuits and techniques known in the art, for example, Sigma-Delta conversion techniques. Digital gain block 806 may be implemented using a digital signal processing and/or custom gain control logic. In an embodiment, gain control block 810 controls the gain of programmable amplifier 802 and the gain of digital gain block 806. In some embodiments, an increase in gain applied to amplifier 802 may be compensated with a corresponding decrease in gain of digital gain block 806. Similarly, a decreasing gain applied to amplifier 802 may be compensated with a corresponding increase in gain of digital gain block 806. Discontinuities in the output signal of programmable gain amplifier 802 may be at least partially compensated by the change in gain in digital gain block 806 to produce a more continuous signal. In some embodiments, the gain change to digital gain block 806 may be applied a period of time after the gain change has been applied to programmable gain amplifier 802 to compensate for conversion and propagation delays. In some embodiments, additional digital signal processing may be applied between analog-to-digital converter 804 and digital-to-analog converter 808. In some embodiments, system and methods of controlling the gain of amplifier 802 and digital gain block 806 may be implemented using systems and methods described in co-pending U.S. patent application Ser. No. 13/447,792, filed on Apr. 16, 2012, entitled "System and Method for High Input Capacitive Signal Amplifier," which is incorporated herein by reference in its entirety. For example, in one embodiment, gain control block 810 measures an amplitude of an analog signal coupled to the programmable gain amplifier, adjusts a first gain of the programmable gain amplifier according to a first gain function, and adjusts a second gain of the digital gain block according to a second gain function.

It should be understood that integrated circuit (IC) 800 is just one example of an IC that uses embodiment programmable gain amplifiers. For example, in alternative embodiments, A/D converter and D/A may be omitted and gain block 806 may be implemented using a further analog programmable gain amplifier. In further embodiments, embodiment programmable gain amplifiers may be applied to systems such as wireless or wire line receivers in which an input signal strength is equalized by a programmable gain amplifier or a variable gain amplifier.

IC 800 may be implemented on a silicon substrate using a CMOS process. Capacitors used in embodiment amplifiers may be implemented using a variety of different capacitor structures including, but not limited to poly-poly capacitors, MOS capacitors, metal-metal capacitors, sandwich capacitors. Alternatively, other processes may be used such as Bipolar, BiCMOS, silicon-on-insulator (SOI), and others.

Figure 9:
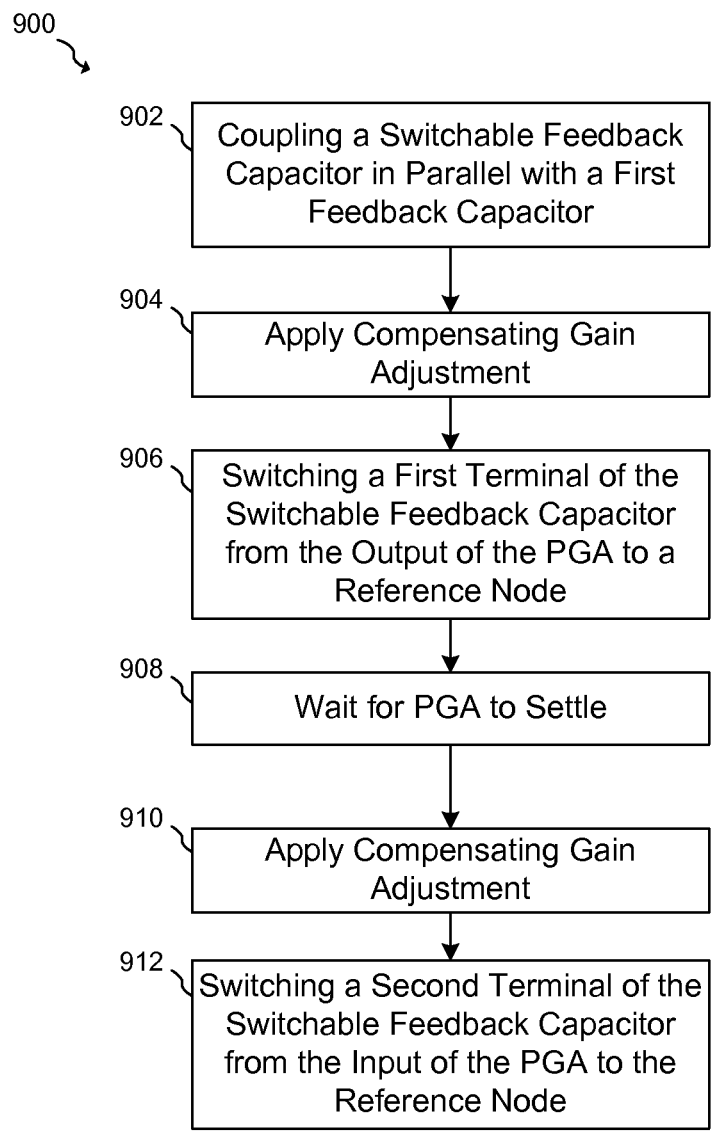
FIG. 9 illustrates an embodiment method.

FIG. 9 illustrates a flowchart of method 900 of operating an embodiment programmable gain amplifier. In step, 902, a switchable feedback capacitor is coupled in parallel with a first feedback capacitor. An optional compensating gain adjustment may be applied in a later stage in step 904. Next, in step 906, a first terminal of the switchable feedback capacitor is switched from an output of the programmable gain amplifier to a reference node. A further optional compensating gain adjustment may be applied in a later stage in step 910. After the programmable gain amplifier settles in step 908, a second terminal of the switchable feedback capacitor may be switched from the input of the programmable gain amplifier to the reference node in step 912. Steps 902 to 912 may be repeated if further gain changes are necessary.

In accordance with an embodiment, a system includes a programmable gain amplifier having a switchable feedback capacitor coupled in parallel with a first capacitor and a controller. The controller is configured to couple the feedback capacitor between an input node of the programmable gain amplifier and an output node of the programmable gain amplifier in a first gain setting, and switch a first terminal of the feedback capacitor from the output of the programmable gain amplifier to a reference node while a second terminal of the feedback capacitor remains coupled to the input node of the programmable gain amplifier for a first time period when transitioning from the first gain setting to a second gain setting. The controller may be is further configured to couple the first terminal of the feedback capacitor to the reference node after the first time period. In some embodiments, a DC component of a voltage at the output of the programmable gain amplifier remains substantially constant between the first gain setting and the second gain setting.

The system may further includes a further programmable gain block coupled to an output of the programmable gain amplifier that is configured to apply a further gain setting that compensates for a gain difference between the first gain setting and the second gain setting. The further programmable gain block may be implemented a digital gain block, and the controller may further configured to measure an amplitude of an analog signal coupled to the programmable gain amplifier, adjust a first gain of the programmable gain amplifier according to a first gain function, and adjust a second gain of the digital gain block according to a second gain function.

In an embodiment, the system may also include an analog-to-digital converter coupled to the output of the programmable gain amplifier, and a digital gain block coupled to an output of the analog-to-digital converter. The digital gain block may be configured to compensate for a gain difference between the first and second gain settings. In some embodiments, a digital-to-analog converter may be coupled to an output of the digital gain block.

The system may further include an input capacitor coupled between the input node of the programmable gain amplifier and a system input terminal. Alternatively, a capacitive signal source, such as a MEMS microphone, may be coupled to the input node of the programmable gain amplifier.

In accordance with a further embodiment, a circuit includes an amplifier, a first capacitor coupled between an input of the amplifier and an output of the amplifier, a second capacitor and a controller. The controller is configured to operate the circuit in a first gain mode by coupling a first terminal of the second capacitor to the input of the amplifier and coupling a second terminal of the second capacitor to the output of the amplifier, and switch the circuit from the first gain mode to a second gain mode by coupling the second terminal of the second capacitor to a reference node for a first time period while the first terminal of the second capacitor remains coupled to the input of the amplifier. In addition, the controller may be further configured to couple the first terminal of the second capacitor to the reference node after the first time period. The amplifier, first capacitor, second capacitor, and controller are disposed on an integrated circuit.

In some embodiments, the reference node may be a ground node and/or may be coupled to a reference voltage generator.

The circuit may also include a third capacitor, and the controller may be further configured to operate the circuit in a third gain mode by coupling a first terminal of the third capacitor to the input of the amplifier and coupling a second terminal of the third capacitor to the output of the amplifier. The controller may also be configured to switch the circuit from the third gain mode to the second gain mode by coupling the second terminal of the third capacitor to the reference node for the first time period while the first terminal of the third capacitor remains coupled to the input of the amplifier.

In an embodiment, the circuit also includes a resistance having a first terminal coupled to the input of the amplifier and a second terminal coupled to the output of the amplifier. The resistance may include a first buffer having a first input coupled to the first terminal of the resistance, a second buffer having a second input coupled to the second terminal of the resistance, resistors coupled in series between an output of the first buffer and an output of the second buffer, transistors coupled in series between the first terminal and the second terminal of the transistor, the transistors comprising control nodes coupled to the resistors.

The amplifier may be implemented using a transistor, such as a MOS transistor, having an output node coupled to the output of the amplifier. In some embodiments, the circuit also includes a first level shifter having a first terminal coupled to the output node of the transistor, and a resistance coupled between an input terminal of the transistor and a second terminal of the level shifter. The circuit may include a second level shifter coupled to the reference node, such that the second terminal of the second capacitor is coupled to the reference node via the second level shifter in the second gain mode. The first level shifter may include a level shifting resistor.

The circuit may also include an input capacitor coupled between an input terminal of the circuit and the input of the amplifier. In addition, a fourth capacitor may be switchably coupled in parallel with the input capacitor. In some embodiments, a MEMS microphone may be coupled to the input of the amplifier.

In accordance with another embodiment, a method of operating a programmable gain amplifier having a first feedback capacitor, and a second feedback capacitor includes coupling the second feedback capacitor between an input node of the programmable gain amplifier and an output node of the programmable gain amplifier in a first gain setting. The method further includes switching a first terminal of the second feedback capacitor from the output of the programmable gain amplifier to a reference node while a second terminal of the second feedback capacitor remains coupled to the input node of the programmable gain amplifier for a first time period when transitioning from the first gain setting to a second gain setting.

In some embodiments, the method further includes coupling the second terminal of the feedback capacitor to the reference node after the first time period. The method may also include coupling a capacitive signal source to the input capacitor. A gain adjustment may be applied to an output of the programmable gain amplifier, such that applying the gain adjustment compensates for a gain different between the first gain setting and the second gain setting.

Advantages of embodiment systems and methods include the ability to provide a switchable gain amplifier that may be compensated to provide a continuous signal and/or a signal having reduced distortion and/or gain switching artifacts.

Further advantages of embodiment systems include the ability to generate a signal of a substantially constant envelope or amplitude so that internal signal processing blocks, such as an A/D converter may be optimized for a specific signal level.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
   a programmable gain amplifier comprising a switchable feedback capacitor coupled in parallel with a first capacitor; and
   a controller configured to
   couple the feedback capacitor between an input node of the programmable gain amplifier and an output node of the programmable gain amplifier in a first gain setting, and
   switch a first terminal of the feedback capacitor from the output of the programmable gain amplifier to a reference node while a second terminal of the feedback capacitor remains coupled to the input node of the programmable gain amplifier for a first time period when transitioning from the first gain setting to a second gain setting.

2. The system of claim 1, wherein the controller is further configured to couple the first terminal of the feedback capacitor to the reference node after the first time period.

3. The system of claim 1, wherein a DC component of a voltage at the output of the programmable gain amplifier remains substantially constant between the first gain setting and the second gain setting.

4. The system of claim 1, further comprising a further programmable gain block coupled to an output of the programmable gain amplifier, the further programmable gain block configured to apply a further gain setting that compensates for a gain difference between the first gain setting and the second gain setting.

5. The system of claim 4, wherein:
   the further programmable gain block comprises a digital gain block; and
   the controller is further configured to:
   measure an amplitude of an analog signal coupled to the programmable gain amplifier,
   adjust a first gain of the programmable gain amplifier according to a first gain function, and
   adjust a second gain of the digital gain block according to a second gain function.

6. The system of claim 1, further comprising:
   an analog-to-digital converter coupled to the output of the programmable gain amplifier; and
   a digital gain block coupled to an output of the analog-to-digital converter, the digital gain block configured to compensate for a gain difference between the first and second gain settings.

7. The system of claim 6, further comprising a digital-to-analog converter coupled to an output of the digital gain block.

8. The system of claim 1, further comprising an input capacitor coupled between the input node of the programmable gain amplifier and a system input terminal.

9. The system of claim 1, further comprising a capacitive signal source coupled to the input node of the programmable gain amplifier.

10. The system of claim 9, wherein the capacitive signal source comprises a MEMS microphone.

11. A circuit comprising:
an amplifier;
a first capacitor coupled between an input of the amplifier and an output of the amplifier;
a second capacitor; and
a controller configured to:
  operate the circuit in a first gain mode by coupling a first terminal of the second capacitor to the input of the amplifier and coupling a second terminal of the second capacitor to the output of the amplifier, and
  switch the circuit from the first gain mode to a second gain mode by coupling the second terminal of the second capacitor to a reference node for a first time period while the first terminal of the second capacitor remains coupled to the input of the amplifier.

12. The circuit of claim 11, wherein the controller is further configured to couple the first terminal of the second capacitor to the reference node after the first time period.

13. The circuit of claim 11, wherein the reference node comprises a ground node.

14. The circuit of claim 11, wherein the reference node is coupled to a reference voltage generator.

15. The circuit of claim 11, further comprising a third capacitor, wherein the controller is further configured to operate the circuit in a third gain mode by coupling a first terminal of the third capacitor to the input of the amplifier and coupling a second terminal of the third capacitor to the output of the amplifier, and
switch the circuit from the third gain mode to the second gain mode by coupling the second terminal of the third capacitor to the reference node for the first time period while the first terminal of the third capacitor remains coupled to the input of the amplifier.

16. The circuit of claim 11, further comprising a resistance having a first terminal coupled to the input of the amplifier and a second terminal coupled to the output of the amplifier.

17. The circuit of claim 16, wherein the resistance comprises:
a first buffer having a first input coupled to the first terminal of the resistance;
a second buffer having a second input coupled to the second terminal of the resistance;
resistors coupled in series between an output of the first buffer and an output of the second buffer; and
transistors coupled in series between the first terminal and the second terminal of the transistor, the transistors comprising control nodes coupled to the resistors.

18. The circuit of claim 11, wherein the amplifier comprises a transistor having an output node coupled to the output of the amplifier.

19. The circuit of claim 18, wherein the transistor comprises a MOS transistor.

20. The circuit of claim 18, further comprising:
a first level shifter having a first terminal coupled to the output node of the transistor; and
a resistance coupled between an input terminal of the transistor and a second terminal of the level shifter.

21. The circuit of claim 20, further comprising a second level shifter coupled to the reference node, wherein the second terminal of the second capacitor is coupled to the reference node via the second level shifter in the second gain mode.

22. The circuit of claim 20, wherein the first level shifter comprises a level shifting resistor.

23. The circuit of claim 11, wherein the amplifier, first capacitor, second capacitor, and controller are disposed on an integrated circuit.

24. The circuit of claim 11, further comprising an input capacitor coupled between an input terminal of the circuit and the input of the amplifier.

25. The circuit of claim 24, further comprising a fourth capacitor switchably coupled in parallel with the input capacitor.

26. The circuit of claim 11, further comprising a MEMS microphone coupled to the input of the amplifier.

27. A method of operating a programmable gain amplifier having a first feedback capacitor, and a second feedback capacitor, the method comprising:
coupling the second feedback capacitor between an input node of the programmable gain amplifier and an output node of the programmable gain amplifier in a first gain setting; and
switching a first terminal of the second feedback capacitor from the output of the programmable gain amplifier to a reference node while a second terminal of the second feedback capacitor remains coupled to the input node of the programmable gain amplifier for a first time period when transitioning from the first gain setting to a second gain setting.

28. The method of claim 27, further comprising coupling the second terminal of the feedback capacitor to the reference node after the first time period.

29. The method of claim 27, further comprising coupling a capacitive signal source to the input capacitor.

30. The method of claim 27, further comprising applying gain adjustment to an output of the programmable gain amplifier, applying the gain adjustment comprising compensating for a gain different between the first gain setting and the second gain setting.

* * * * *